United States Patent
Wilkinson et al.

(10) Patent No.: US 9,647,770 B1
(45) Date of Patent: May 9, 2017

(54) SYSTEM AND METHOD FOR PRODUCING HIGH-PRECISION ELECTRICAL SIGNALS AND CONTINUOUS-WAVE OPTICAL SIGNALS

(71) Applicant: Raytheon Company, Waltham, MA (US)

(72) Inventors: Steven R. Wilkinson, Stevenson Ranch, CA (US); Bishara Shamee, Playa Del Rey, CA (US)

(73) Assignee: Raytheon Company, Waltham, MA (US)

( * ) Notice: Subject to any disclaimer, the term of this patent is extended or adjusted under 35 U.S.C. 154(b) by 20 days.

(21) Appl. No.: 14/921,146

(22) Filed: Oct. 23, 2015

(51) Int. Cl.
*H04B 10/00* (2013.01)
*H04B 10/70* (2013.01)
(Continued)

(52) U.S. Cl.
CPC ............ *H04B 10/70* (2013.01); *H04B 10/25* (2013.01); *H04B 10/541* (2013.01); *H04B 10/572* (2013.01); *H04L 7/0075* (2013.01)

(58) Field of Classification Search
CPC ...... H04B 10/70; H04B 10/25; H04B 10/572; H04B 10/541; H04L 7/0075
See application file for complete search history.

(56) References Cited

U.S. PATENT DOCUMENTS 5,723,856 A * 3/1998 Yao .................. G02F 1/0123
250/205

7,027,675 B2 * 4/2006 Sayyah ................ G02F 1/0121
385/14

(Continued)

FOREIGN PATENT DOCUMENTS

EP 2629381 A1 8/2013
WO WO-03043177 A2 5/2003

OTHER PUBLICATIONS

"International Application Serial No. PCT/US2016/048174, International Search Report mailed Nov. 23, 2016", 4 pgs.

(Continued)

*Primary Examiner* — Danny Leung
(74) *Attorney, Agent, or Firm* — Schwegman Lundberg & Woessner, P.A.

(57) ABSTRACT

A photonic oscillator can produce a multifrequency optical signal having a spectrum that includes regularly spaced spectral lines. A photodetector can convert the multifrequency optical signal to a multifrequency electrical signal having a spectrum that includes the regularly spaced spectral lines. A bandpass filter can attenuate all but one spectral line of the spectrum of the multifrequency electrical signal to form a single-frequency electrical signal having leading/trailing edges that have the same precision as the photonic oscillator. A continuous-wave laser can lock to the multifrequency optical signal and produce a continuous-wave optical signal at a wavelength precisely locked to the photonic oscillator. A data encoder/decoder can modulate/demodulate a data stream onto/from the continuous-wave optical signal at a data rate of the single-frequency electrical signal. The modulated optical signal can be clocked with the leading/trailing edges of the single-frequency electrical signal.

20 Claims, 8 Drawing Sheets

(51) Int. Cl.
  *H04B 10/25* (2013.01)
  *H04B 10/54* (2013.01)
  *H04L 7/00* (2006.01)
  *H04B 10/572* (2013.01)

(56) References Cited

U.S. PATENT DOCUMENTS

| | | | | |
|---|---|---|---|---|
| 7,324,256 B1* | 1/2008 | Sayyah | ............ | H04B 10/2575 359/239 |
| 7,499,653 B2* | 3/2009 | Yap | ............ | G02F 2/002 398/115 |
| 7,650,080 B2* | 1/2010 | Yap | ............ | G02F 2/02 398/161 |
| 8,681,827 B2 | 3/2014 | Maleki et al. | | |
| 8,780,948 B2 | 7/2014 | Wilkinson et al. | | |
| 2003/0090767 A1* | 5/2003 | Yap | ............ | G02B 6/2861 398/183 |
| 2003/0091097 A1* | 5/2003 | Yap | ............ | G02F 2/002 375/132 |
| 2004/0264977 A1* | 12/2004 | Yap | ............ | G02F 2/02 398/161 |
| 2006/0251424 A1 | 11/2006 | Nicholson et al. | | |
| 2012/0155584 A1 | 6/2012 | Wilkinson et al. | | |
| 2012/0294319 A1* | 11/2012 | Maleki | ............ | G02F 2/00 372/18 |
| 2013/0003766 A1 | 1/2013 | Savchenkov et al. | | |

OTHER PUBLICATIONS

"International Application Serial No. PCT/US2016/048174, Written Opinion mailed Nov. 23, 2016", 5 pgs.

Yao, X S, et al., "A novel photonic oscillator", Flat Panel Display Technology/Technologies for a Global Information Infrastructure/ Ics for New Age Lightwave Communi Cations/Rf Optoelectronics, 1995 Digest of the Leos Summer Topical Meetings, (Aug. 15, 1995), 17-18.

* cited by examiner

SYSTEM AND METHOD FOR PRODUCING HIGH-PRECISION ELECTRICAL SIGNALS AND CONTINUOUS-WAVE OPTICAL SIGNALS

TECHNICAL FIELD

The present disclosure relates to a system and method for producing electrical and optical signals that can be directed to a data encoder (e.g., a data modulator) or data decoder (e.g., a data demodulator).

BACKGROUND

As telecommunication data rates increase, the clocking requirements of a data channel can be challenging for optical and electrical signals that drive the data channel.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various examples discussed in the present document.

DETAILED DESCRIPTION

As data rates of communication systems increase over time, producing a clock signal having sufficiently low jitter can be increasingly challenging. In some examples, communication systems can use electrical techniques, such as phase-locked loops, up/down frequency conversions, and retiming, to try and reduce the jitter of a clock signal. These electrical techniques can be cumbersome and expensive for very high data rates.

The systems and methods discussed herein can produce optical and electrical signals for communication systems, and can do so in a way that has reduced jitter without resorting to the aforementioned electrical techniques. As such, the systems and methods discussed herein can simplify and reduce the cost of a communication system.

In an example of a system and method discussed herein, a high-precision (e.g., low-jitter) photonic oscillator can produce a multifrequency optical signal having a spectrum that includes regularly spaced spectral lines. A photodetector can convert the multifrequency optical signal to a multifrequency electrical signal having a spectrum that includes the regularly spaced spectral lines. A bandpass filter can attenuate all but one spectral line of the spectrum of the multifrequency electrical signal to form a single-frequency electrical signal having the same precision as the photonic oscillator. A continuous-wave laser can lock to the multifrequency optical signal and produce a continuous-wave optical signal at a wavelength precisely locked to the photonic oscillator. A data encoder/decoder can modulate/demodulate a data stream onto/from the continuous-wave optical signal at a data rate of the single-frequency electrical signal. (Such an encoder/decoder can also be referred to as a modulator/demodulator.) The modulated optical signal can be clocked with the leading/trailing edges of the single-frequency electrical signal. The leading/trailing edges of the single-frequency electrical signal can have a well-defined phase over time, and can therefore be considered to be coherent. Transmitters and/or receivers that use the optical signal(s) discussed herein can be considered to be transceivers.

The preceding paragraph is but a summary of one example of a suitable system and method that can produce the low-jitter signals, and is not intended to be limiting in any way. Other suitable examples are described in detail below.

Figure 1:
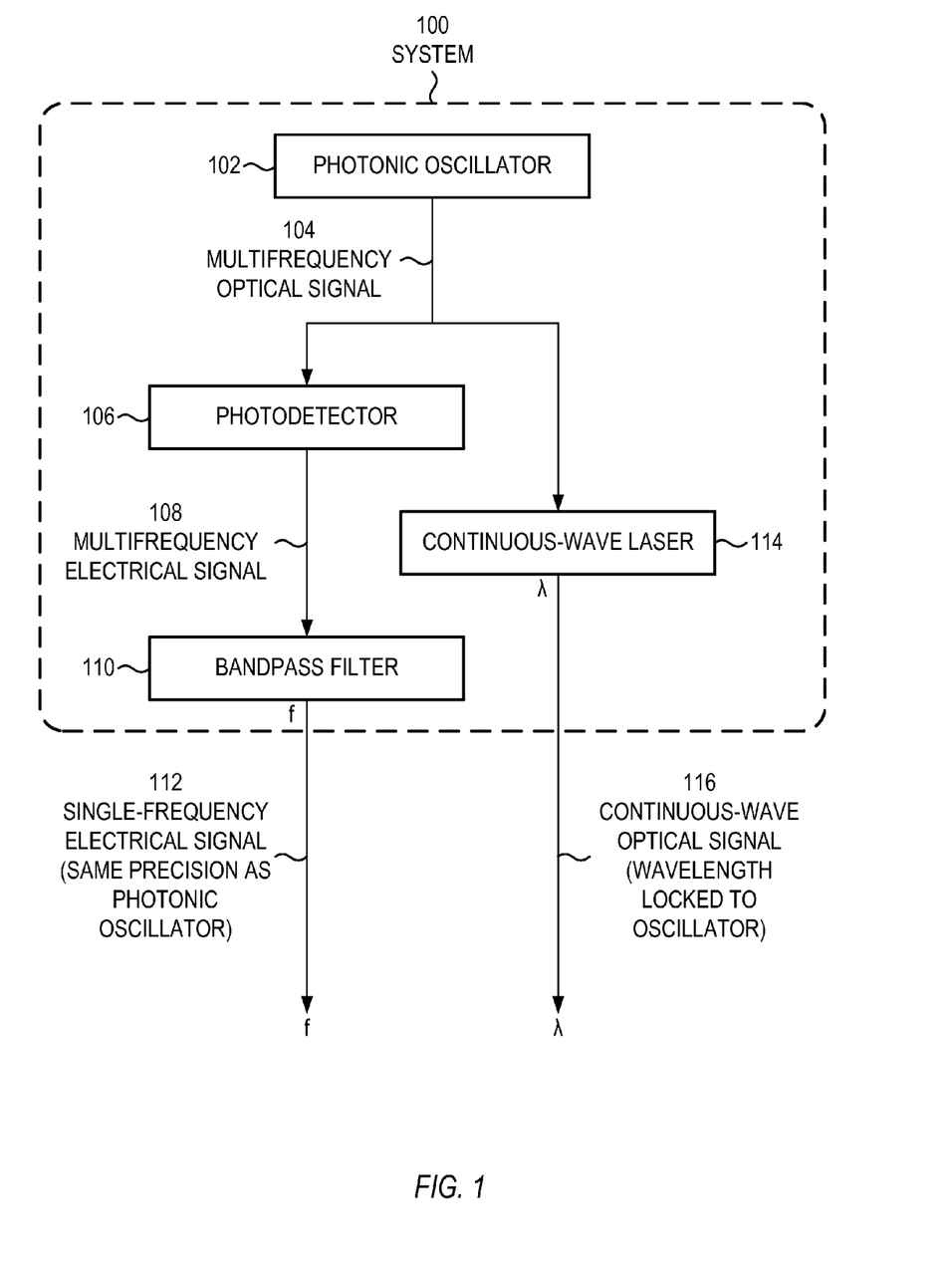
FIG. 1 shows an example of a system that can produce a low-jitter signal that can be used for applications such as clocking a communication system, in accordance with some embodiments.

FIG. 1 shows an example of a system 100 that can produce a low-jitter signal that can be used for applications such as clocking a communication system, in accordance with some embodiments. The system 100 is but one example of a configuration for such a system; other suitable configurations can also be used.

A photonic oscillator 102 can be configured to produce a multifrequency optical signal 104 having a spectrum that includes regularly spaced spectral lines. In some examples, the multifrequency optical signal 104 can be referred to as an optical comb. When viewed in the time domain, rather than the frequency domain, the multifrequency optical signal 104 can appear as a train of optical pulses. In some examples, the duration of the pulses and/or the spacing between the pulses can be on the order of one or a few femtoseconds. In a specific example, the multifrequency optical signal 104 can have a spectrum having regularly spaced spectral lines that extend across 200 THz with a spacing of 200 MHz. In another specific example, the multifrequency optical signal 104 can have a spectrum having regularly spaced spectral lines that extend in a frequency range from 125 THz to 250 THz, with spacing of 200 MHz. These are but two numerical examples, and it will be understood that other suitable numerical values can also be used.

An example of a suitable photonic oscillator 102 is described in detail in U.S. Pat. No. 8,780,948 (hereinafter referred to as '948), titled "Precision photonic oscillator and method for generating an ultra-stable frequency reference using a two-photon rubidium transition", and issued on Jul. 15, 2014 to Wilkinson et al. The complete disclosure of U.S. Pat. No. 8,780,948 is incorporated by reference herein. Element 115 of the '948 patent, referred to in the '948 patent as a super-continuum of optical wavelengths, can be directed out of the system of the '948 patent by a suitably positioned beamsplitter, and is an example of a suitable multifrequency optical signal 104. It is found that the device of the '948 is particularly well-suited for system 100, due to the extremely low phase noise of a laser that can be locked to the photonic oscillator 102. Such a low-phase noise laser can have a linewidth between 1 Hz and 5 Hz, or, optionally, lower than 1 Hz. Such a low-phase noise laser can produce signals having less than 10 femtoseconds of jitter, over a suitable bandwidth. Using a laser with such a small linewidth, as described below, can eliminate the need for preparation circuitry, such as additional phase-locked loops, up/down conversions, or retiming, which would otherwise be used to reduce the phase noise of the laser. The device of the '948 patent is but one example of a suitable photonic oscillator 102; other suitable devices that produce high-precision multifrequency optical signals or high-precision optical combs can also be used.

A beamsplitter, such as a plate beamsplitter, a cube beamsplitter, or a fiber beamsplitter, can split the multifrequency optical signal 104 into more than one optical path, as needed. The beamsplitter is not shown in FIG. 1.

A photodetector 106 can be configured to convert the multifrequency optical signal 104 to a multifrequency electrical signal 108 having a spectrum that includes the regularly spaced spectral lines. In some examples, the photodetector 106 can have a response time fast enough to include an upper end of the spectral lines in the multifrequency optical signal 104. In some examples, the photodetector 106 can have a bandwidth large enough to include all or a selected portion of the spectral lines in the multifrequency optical signal 104.

A bandpass filter 110 can be configured to attenuate all but one selected spectral line of the spectrum of the multifrequency electrical signal 108 to form a single-frequency electrical signal 112 at the frequency of the selected spectral line. In some examples, bandpass filter 110 can select a single line (sometimes referred to as a tooth) from the optical comb. In some examples, the frequency of the selected spectral line can correspond to a data rate of a data stream (e.g., the rate at which the modulations can change in the data stream). In some examples, frequency of the selected spectral line can correspond to a multiple of the data rate of the data stream, or a fraction of the data rate of the data stream.

A continuous-wave laser 114 can be configured to lock to the multifrequency optical signal 104 and produce a continuous-wave optical signal 116 at a specified wavelength in response to the multifrequency optical signal 104. In some examples, the continuous-wave laser 114 can lock directly to the multifrequency optical signal 104, without using preparation circuitry, such as additional phase-locked loops, up/down conversions, or retiming, which would otherwise be used to reduce the phase noise of the continuous-wave laser 114. In some examples, the continuous-wave laser 114 can include a servo system to lock a wavelength of the continuous-wave laser 114 to the high-precision multifrequency optical signal 104, so that the wavelength stabilizes based on a stability of the multifrequency optical signal 104. In some examples, the servo system can include a closed-loop feedback system. In some examples, the closed-loop feedback system can generate an electrical error signal that crosses zero when the wavelength of the continuous-wave laser 114 crosses a desired wavelength. In some examples, the closed-loop feedback system can vary a physical property, such as a voltage or a cavity length, in response to the error signal, to ensure that the wavelength of continuous-wave laser 114 remains locked to the desired wavelength. In some examples, the continuous-wave laser 114 can have a wavelength between 1525 nm and 1625 nm, inclusive, which can include the C-band and L-band commonly used in optical fiber-based communication systems. In some examples, the continuous-wave laser 114 can have a wavelength corresponding to a specified channel in one of the C-band or L-band commonly used in optical fiber-based communication systems.

The output of system 100 can include two quantities. A first output quantity can be single-frequency electrical signal 112, which can be a periodic signal with a frequency (f) matched to a single line of the mutlifrequency optical signal 104. In some examples, the single-frequency electrical signal 112 can have leading and/or trailing edges that have the same precision as the photonic oscillator 102. A second output quantity can be continuous-wave optical signal 116, which can include laser light having constant power (e.g., not modulated over time), and having a wavelength ($\lambda$) that is locked to the photonic oscillator 102. The output quantities 112, 116 can be directed as needed to downstream elements, such as a data encoder (FIG. 2), a data decoder (FIG. 3), or other suitable elements or systems that can utilize a low-jitter electrical signal at a single frequency (f) and continuous-wave laser light having a well-controlled wavelength ($\lambda$).

Figure 2:
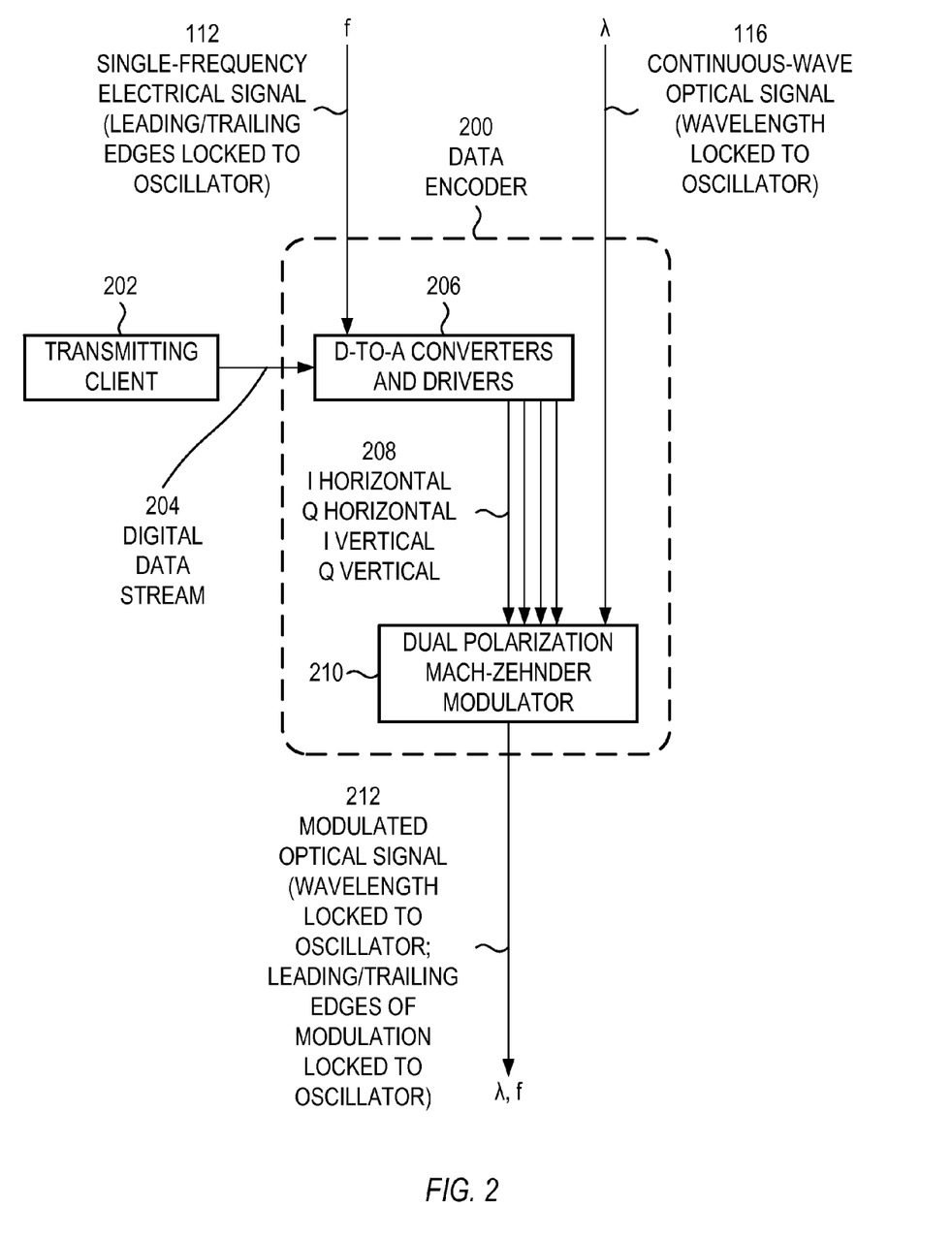
FIG. 2 shows an example of a data encoder, in accordance with some embodiments.

FIG. 2 shows an example of a data encoder 200, in accordance with some embodiments. Data encoder 200 is but one example of a data encoder; other data encoders can also be used. A data encoder 200 can also be referred to as a data modulator, which can modulate a signal to include data.

Data encoder 200 can be configured to receive a digital data stream 204 representing digital data, such as from a transmitting client 202. Data encoder 200 can be further configured to modulate the continuous-wave optical signal 116 (FIG. 1) to include the digital data. The modulation can be synchronized to the single-frequency electrical signal 112 (FIG. 1) at the frequency of the selected spectral line. Data encoder 200 can be further configured to produce a modulated optical signal 212 at the wavelength ($\lambda$) of the continuous-wave optical signal 116 and modulated at the frequency (f) of the selected spectral line. In some examples, data encoder 200 can be further configured to modulate the continuous-wave optical signal 116 using quadrature amplitude modulation, such as 16-QAM, 64-QAM, 256-QAM, 1024-QAM, or, optionally, 2048-QAM or 4096-QAM including multi-ring constellations.

Although any suitable data encoder can be used, FIG. 2 shows one example of a configuration for data encoder 200. Digital-to-analog converters and drivers 206 can receive digital data from the digital data stream 204 at a rate synchronized to the leading and/or trailing edges of single-frequency electrical signal 112.

In the example of FIG. 2, digital-to-analog converters and drivers 206 can produce a total of four electrical signals 208, the four being unique combinations of two being in-phase (I) and the other two being in quadrature (Q; e.g., 90 degrees out of phase with the in-phase signals), and two with a horizontal polarization and the other two with a vertical polarization (e.g., perpendicular in orientation to the horizontal polarization). The four signals 208 drive a dual polarization Mach-Zehnder modulator, and impart a suitable modulation onto continuous-wave optical signal 116 in accordance with a selected modulation technique, such as quadrature amplitude modulation, including 16-QAM, 32-QAM, 64-QAM, 256-QAM, 1024-QAM, or, optionally, 2048-QAM or 4096-QAM including multi-ring constellations, to form modulated optical signal 212. Modulated optical signal 212 has the same wavelength (λ) as the continuous-wave optical signal 116 and is modulated at the frequency (f) of the selected spectral line of the optical comb. FIG. 2 shows but one suitable configuration for a data encoder; other configurations can also be used.

In some examples, the system 100 can supply one or more additional single-frequency electrical signals, produced in a manner similar to 112, but with respective additional delay lines between photonic oscillator 102 and photodetector 106. Each additional delay line can impart a specified phase delay to the respective single-frequency electrical signal. In some examples, a phase-delayed single-frequency electrical signal can include a phase delay of 90 degrees, to form the quadrature signal, Q. In more general quadrature amplitude modulation schemes, which can use phase delays having values other than 90 degrees, the system 100 can use delay lines having phase delays of multiples of (360 degrees/M), where M is number of radial locations for a particular modulation constellation.

Figure 3:
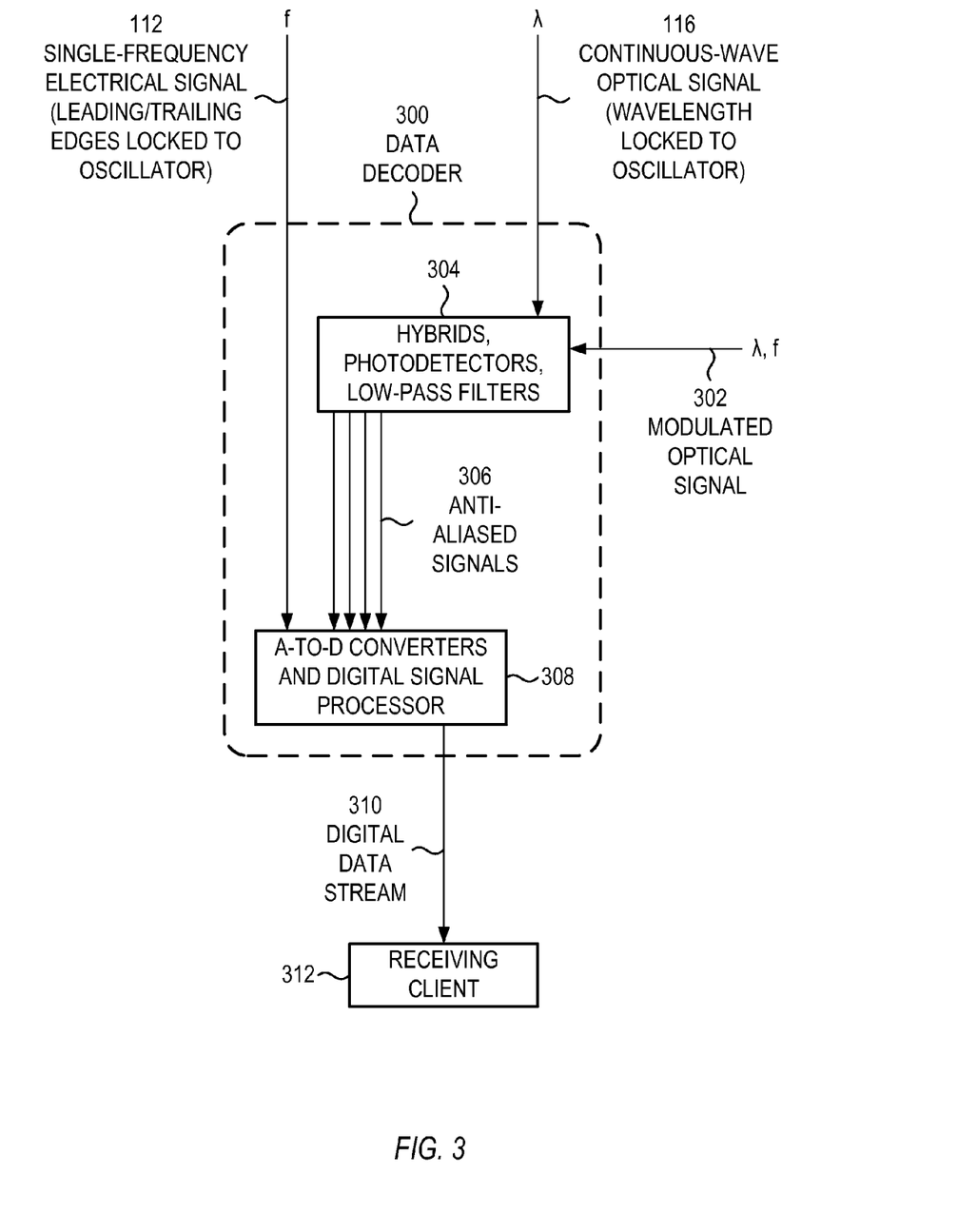
FIG. 3 shows an example of a data decoder, in accordance with some embodiments.

FIG. 3 shows an example of a data decoder 300, in accordance with some embodiments. Data decoder 300 is but one example of a data decoder; other data decoders can also be used. A data decoder 300 can also be referred to as a data demodulator, which can extract data from a modulated signal.

Data decoder 300 can be configured to receive a modulated optical signal 302 at wavelength λ and modulated at the frequency f of the selected spectral line. Data decoder 300 can be further configured to demodulate the modulated optical signal 302 to extract digital data encoded on the modulated optical signal 302. The demodulation can be synchronized to the single-frequency electrical signal 112 at the frequency (f) of the selected spectral line. Data decoder 300 can be configured to produce a digital data stream 310 representing the extracted digital data. In some examples, data decoder 300 can be further configured to demodulate the modulated optical signal using quadrature amplitude demodulation, such as 16-QAM, 64-QAM, 256-QAM, 1024-QAM, or, optionally, 2048-QAM or 4096-QAM including multi-ring constellations.

Although any suitable data decoder can be used, FIG. 3 shows one example of a configuration for data decoder 300. At 304 two polarizing beam splitters can receive the modulated optical signal 302 and the continuous-wave optical signal 116, respectively. Each polarizing beam splitter directs a respective polarization component onto a respective 90-degree hybrid element, at 304. In other words, one 90-degree hybrid element receives a horizontal polarization component from each polarizing beam splitter, and the other 90-degree hybrid element receives a vertical polarization component from each polarizing beam splitter. Each 90-degree hybrid element, at 304, can direct four optical signals onto four respective photodetectors, at 304. Four subtracting elements, at 304, form difference signals for each pair of electrical signals from the photodetectors, which can remove bias from the signals. Four amplifiers, at 304, can amplify the respective four difference signals. Four low-pass filters, at 304, can remove artifacts caused by aliasing. The four anti-aliased signals 306 can strike respective analog-to-digital converters at 308. A digital signal processor, at 308, can convert the four anti-aliased signals 306 into horizontal and vertical data. Digital signal processor can effectively undo the encoding performed by a data encoder, such as 200 (FIG. 1), to produce a digital data stream 310. The digital data stream 310 can be directed to a receiving client 312. In some examples, the system 100 can supply one or more additional single-frequency electrical signals with respective additional delay lines between photonic oscillator 102 and photodetector 106, for use in a manner similar to as described above with respect to the data encoder 200 (FIG. 2). FIG. 3 shows but one suitable configuration for a data decoder; other configurations can also be used.

Figure 4:
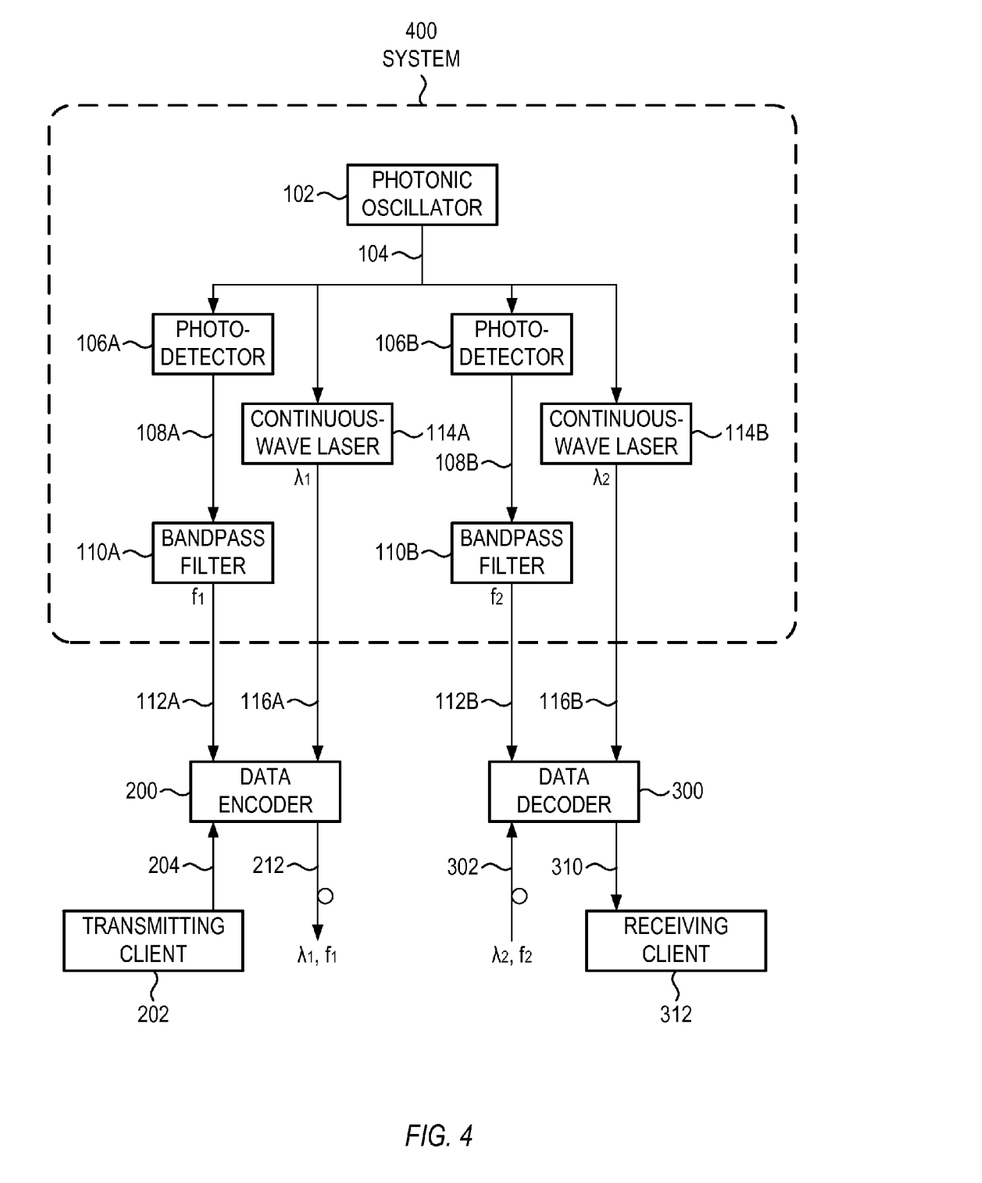
FIG. 4 shows an example of a system that can produce low-jitter signals that can be used with a data encoder and a data decoder in a communication system, in accordance with some embodiments.

Whereas FIG. 1 shows a system 100 that can work with either a data encoder 200 (FIG. 2) or a data decoder (FIG. 3), it may be beneficial to use an expanded system that can work simultaneously with both a data encoder and a data decoder, as is typically done in communication systems. FIG. 4 shows an example of such a system.

FIG. 4 shows an example of a system 400 that can produce low-jitter signals that can be used with a data encoder and a data decoder in a communication system, in accordance with some embodiments. The system 400 is but one example of a configuration for such a system; other suitable configurations can also be used.

System 400 includes photonic oscillator 102, which can be configured to produce multifrequency optical signal 104 having a spectrum that includes regularly spaced spectral lines. Photonic oscillator 102 and multifrequency optical signal 104 can be identical in structure and function to the corresponding elements shown in FIG. 1. Multiple beamsplitters can split the multifrequency optical signal 104 into multiple optical paths, as needed. The beamsplitters are not shown in FIG. 4.

System 400 can include two sets of components and signals 106A-116A and 106B-116B, which can be similar in structure and function to corresponding components and signals 106-116 in FIG. 1, but with a first set 106A-116A being directed to encoding and a second set 106B-116B being directed to decoding.

System 400 can include two continuous-wave lasers 114A, 114B, each of which can be locked to the multifrequency optical signal 104 at any suitable wavelength. For instance, first continuous-wave laser 114A can produce a first continuous-wave optical signal at wavelength 4 and second continuous-wave laser 114B can produce a second continuous-wave optical signal at wavelength $\lambda_2$. Wavelengths $\lambda_1$ and $\lambda_2$ can correspond to wavelengths at which modulated optical signals 212 and 302 are transmitted and received from the data encoder 200 and data decoder 300, respectively. In some examples, wavelengths $\lambda_1$ and $\lambda_2$ can be selected from a plurality of specified wavelengths defined by a particular industry standard, such as the telecommunications C-band or L-band. In some examples, the specified wavelengths can correspond to predefined channels in a particular band, such as channels in the telecommunications C-band or L-band. In most examples, wavelengths $\lambda_1$ and $\lambda_2$ can be different, so that data can be transmitted and received on different channels. In other examples, wavelengths $\lambda_1$ and $\lambda_2$ can be the same, so that data can be transmitted and received on the same channel. In some examples, system 400 can include one or more tuning mechanisms, which can select a suitable wavelength as needed, for instance, to match a wavelength of received optical signal 302.

System 400 can also include two bandpass filters 110A, 110B, each of which can select a single spectral line from the spectrum of the corresponding multifrequency electrical signal 108A, 108B, and attenuate all but the respective selected spectral line. For instance, first bandpass filter 110A can be configured to attenuate all but a first spectral line of the spectrum of first multifrequency electrical signal 108A to form a first single-frequency electrical signal 112A at the frequency ($f_1$) of the first spectral line, and second bandpass filter 110B can be configured to attenuate all but a second spectral line of the spectrum of second multifrequency electrical signal 108B to form a second single-frequency electrical signal 112B at the frequency ($f_2$) of the second spectral line. In some examples, the frequencies ($f_1$, $f_2$) can correspond to data rates of the modulated optical signals 212 and 302 transmitted and received from the data encoder 200 and data decoder 300, respectively. In some examples, the frequencies ($f_1$, $f_2$) can correspond to multiples or fractions of the data rates. In most examples, frequencies $f_1$ and $f_2$ can be the same, so that a transmitted data rate matches a received data rate. In other examples, frequencies $f_1$ and $f_2$ can be different. In some examples, system 400 can include one or more tuning mechanisms, which can select a suitable frequency as needed, for instance, to match a frequency of received optical signal 302.

Figure 5:
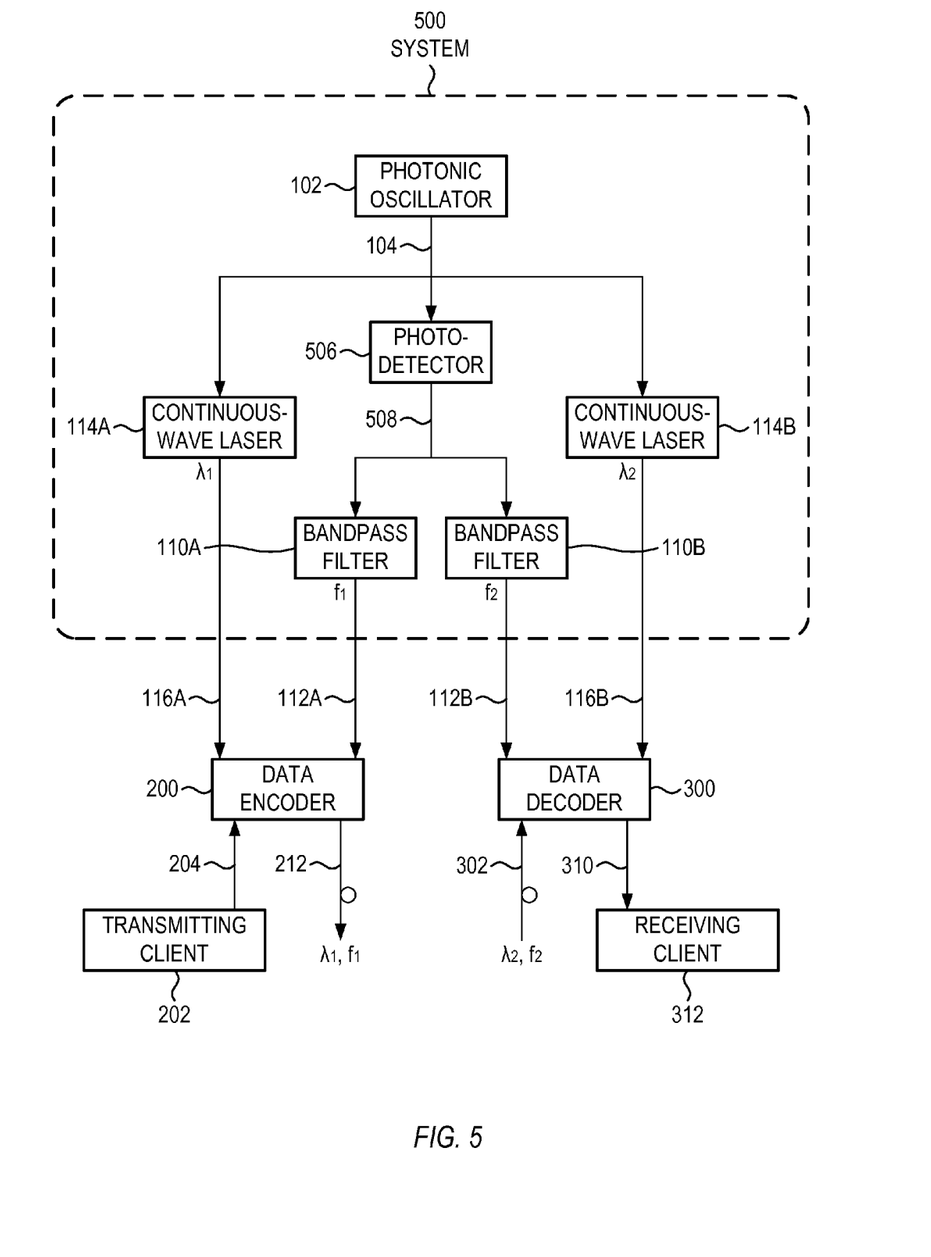
FIG. 5 shows an alternate configuration of a system that replaces two photodetectors with a single photodetector, in accordance with some embodiments.

FIG. 5 shows an alternate configuration of system 500 that replaces the two photodetectors 106A, 106B with a single photodetector 506, in accordance with some embodiments. Photodetector 506 can produce a single multifrequency electrical signal 508, which can be split and directed to both bandpass filters 110A, 110B. The other elements and signals in system 500 can be identical in structure and function to the corresponding elements and signals in system 400.

In the configurations of FIGS. 4 and 5, bandpass filters 110A, 110B select first and second spectral lines from the multifrequency electrical signal(s) to produce first and second single-frequency electrical signals 112A, 112B at respective frequencies $f_1$ and $f_2$. In some examples, frequencies $f_1$ and $f_2$ can be the different. In other examples, frequencies $f_1$ and $f_2$ can be the same. For examples in which frequencies $f_1$ and $f_2$ are the same, the functions of the two bandpass filters 110A, 110B can be combined into a single bandpass filter.

Figure 6:
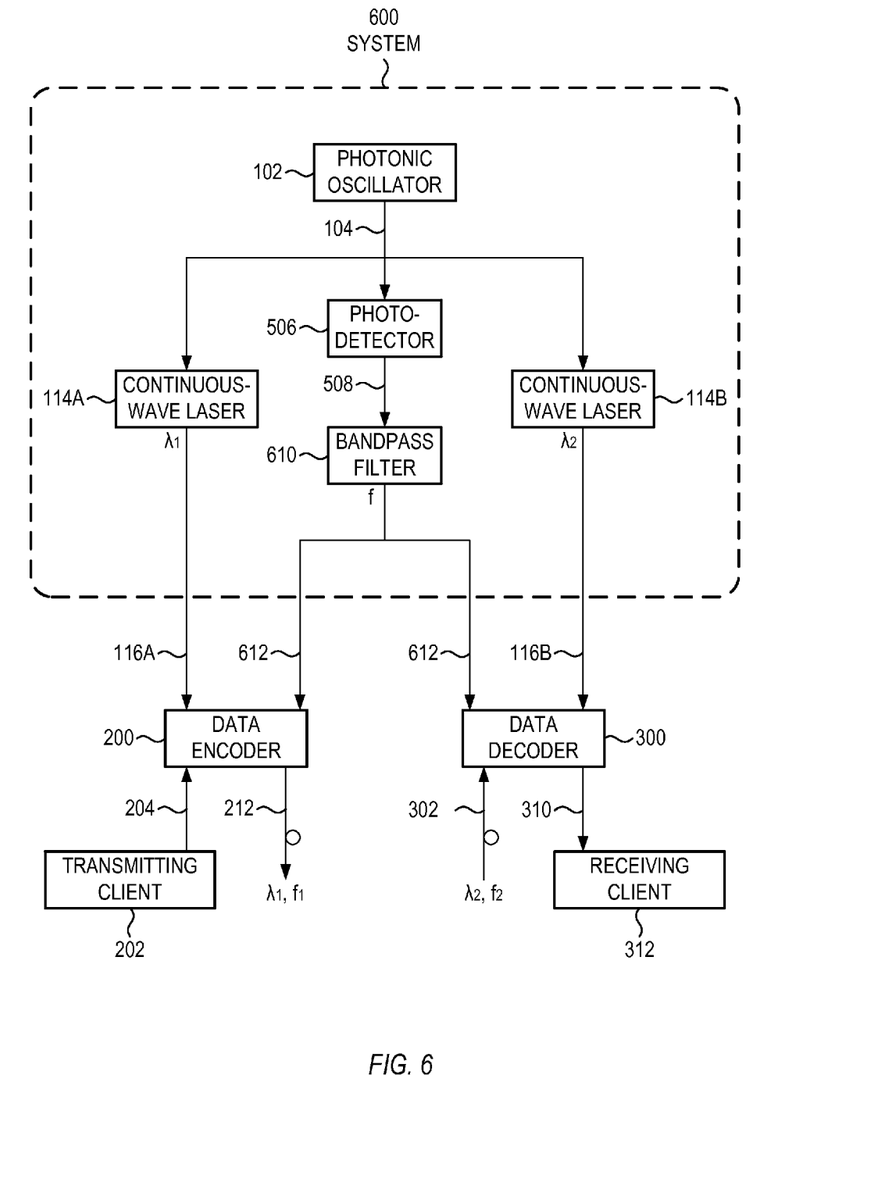
FIG. 6 shows an alternate configuration of a system that replaces two bandpass filters with a single bandpass filter, in accordance with some embodiments.

FIG. 6 shows an alternate configuration of system 600 that replaces the two bandpass filters 110A, 110B with a single bandpass filter 610, in accordance with some embodiments. Bandpass filter 610 can select a single spectral line from multifrequency electrical signal 508 to form a single-frequency electrical signal 612, which can be split and directed to both data encoder 200 and data decoder 300. The other elements and signals in system 600 can be identical in structure and function to the corresponding elements and signals in system 500.

Figure 7:
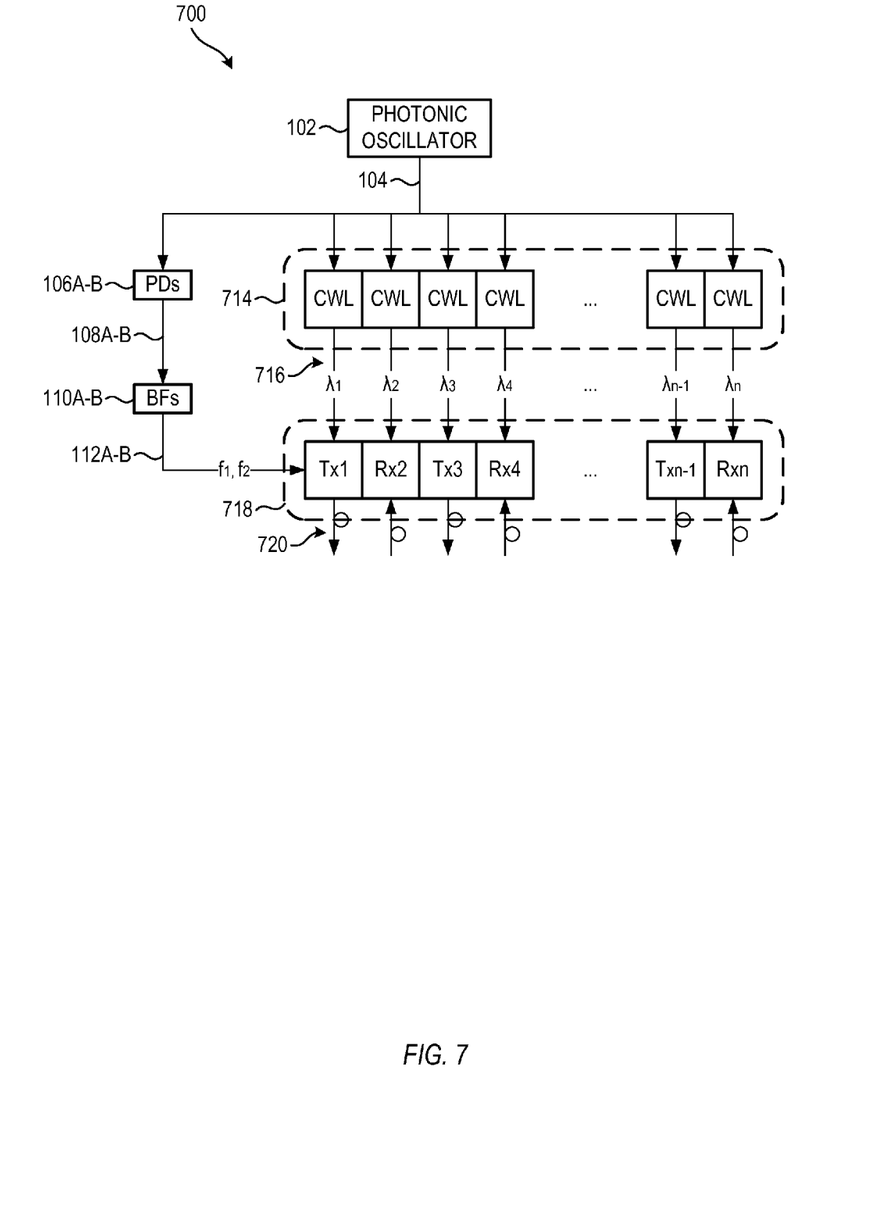
FIG. 7 shows an alternate configuration of a system that can be used simultaneously with multiple transmitted and received channels, in accordance with some embodiments.

FIG. 7 shows an alternate configuration of system 700 that can be used simultaneously with multiple transmitted and received channels, in accordance with some embodiments. The configuration of FIG. 7 is but one example; other suitable configurations of system 700 can also be used.

In system 700, a photonic oscillator 102 can produce a multifrequency optical signal 104 having a spectrum that includes regularly spaced spectral lines. A first photodetector 106A can convert the multifrequency optical signal 104 to a first multifrequency electrical signal 108A having a spectrum that includes the regularly spaced spectral lines. A first bandpass filter 110A can attenuate all but a first spectral line of the spectrum of the first multifrequency electrical signal 108A to form a first single-frequency electrical signal 112A at the frequency of the first spectral line.

In some examples, such as when the data rates of the data encoders and data decoders are equal, the system 700 can supply the first single-frequency electrical signal 112A to both the data encoders and the data decoders. In other examples, such as when the data rate of the data encoders differs from the data rate of the data decoders, the system 700 can include a second set of elements to generate a second multifrequency electrical signal. For example, a second photodetector 106B can convert the multifrequency optical signal 104 to a second multifrequency electrical signal 108B having a spectrum that includes the regularly spaced spectral lines, and a second bandpass filter 110B can attenuate all but a second spectral line of the spectrum of the second multifrequency electrical signal 108B to form a second single-frequency electrical signal 112B at the frequency of the second spectral line.

A plurality of continuous-wave lasers 714 can be configured to lock to the multifrequency optical signal 104 and produce respective continuous-wave optical signals 716 at respective wavelengths in response to the multifrequency optical signal 104. In some examples, the wavelengths of the plurality of continuous-wave optical signals 716 can be different from one another.

System 700 can optionally further include a plurality of data encoders ($Tx_i$) at 718. Each data encoder of the plurality can be configured to receive a digital data stream representing digital data (not shown), modulate the respective continuous-wave optical signal to include the digital data, the modulation being synchronized to the first single-frequency electrical signal 112A at the frequency of the first spectral line, and produce a respective modulated optical signal, at 720, at the respective wavelength and modulated at the frequency of the first spectral line. In some examples, each data encoder, at 718, is further configured to modulate the respective continuous-wave optical signal 716 using quadrature amplitude modulation System 700 can optionally further include a plurality of data decoders ($Rx_i$) at 718. Each data decoder of the plurality can be configured to receive a respective modulated optical signal, at 720, at the respective wavelength and modulated at the frequency of the second spectral line, demodulate the modulated optical signal to extract digital data encoded on the modulated optical signal, the demodulation being synchronized to the second single-frequency electrical signal 112B at the frequency of the second spectral line, and produce a digital data stream (not shown) representing the extracted digital data. In some examples, each data decoder, at 718, is further configured to demodulate the respective modulated optical signal, at 720, using quadrature amplitude demodulation. In some examples, the frequencies of the first and second spectral lines are equal; in other examples, the frequencies of the first and second spectral lines are different.

Figure 8:
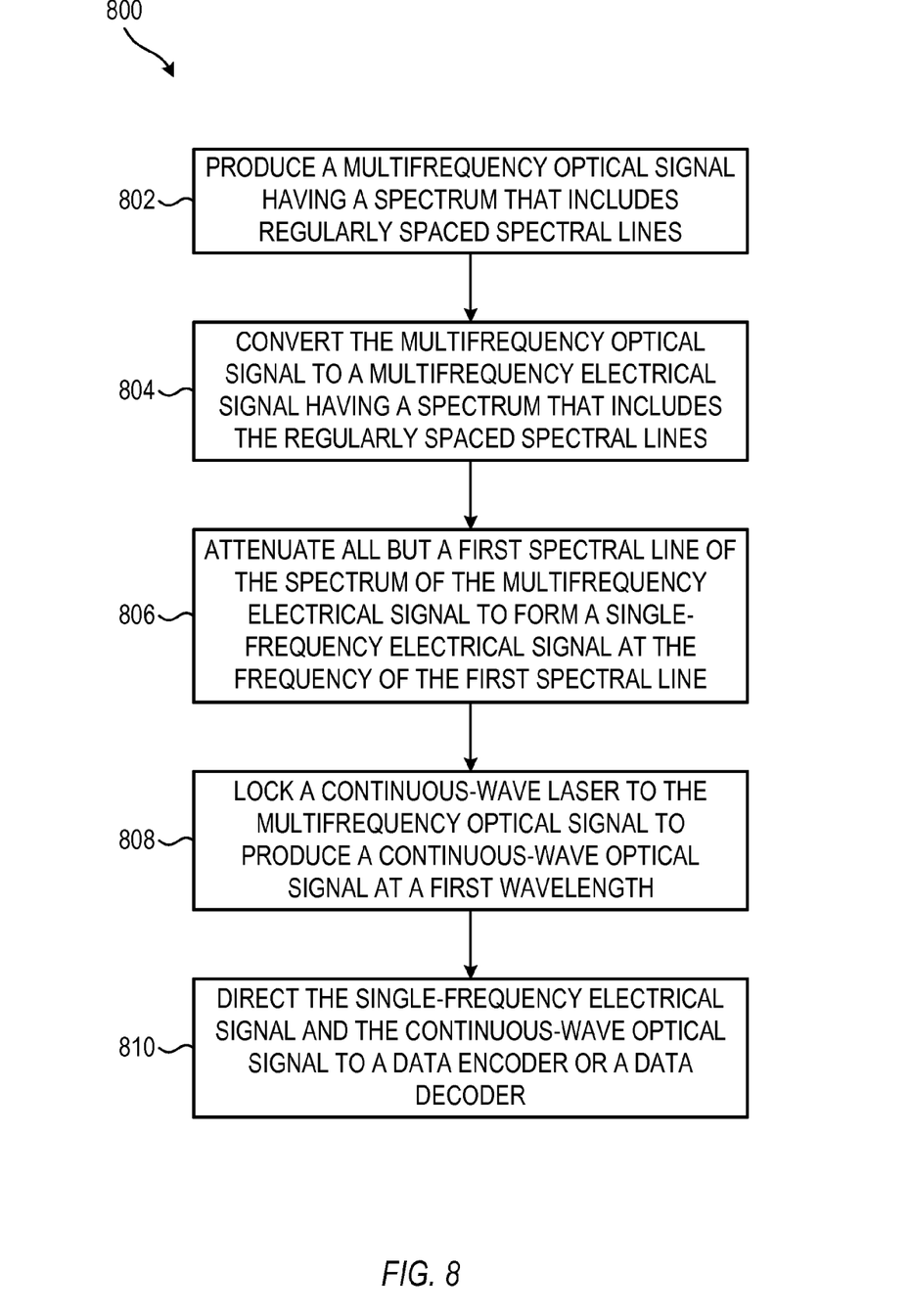
FIG. 8 shows an example of a method for producing high-precision single-frequency electrical signals and continuous-wave optical signals, in accordance with some embodiments.

FIG. 8 shows an example of a method 800 for producing high-precision single-frequency electrical signals and continuous-wave optical signals, in accordance with some embodiments. Method 800 can be executed on systems, such as 100 (FIG. 1), 400 (FIG. 4), 500 (FIG. 5), 600 (FIG. 6), 700 (FIG. 7), or other suitable systems. Method 800 is but one example; other suitable methods can also be used.

At 802, a system can produce a multifrequency optical signal having a spectrum that includes regularly spaced spectral lines.

At 804, the system can convert the multifrequency optical signal to a multifrequency electrical signal having a spectrum that includes the regularly spaced spectral lines.

At 806, the system can attenuate all but a first spectral line of the spectrum of the multifrequency electrical signal to form a single-frequency electrical signal at the frequency of the first spectral line.

At 808, the system can lock a continuous-wave laser to the multifrequency optical signal to produce a continuous-wave optical signal at a first wavelength.

At 810, the system can direct the single-frequency electrical signal and the continuous-wave optical signal to a data encoder or a data decoder.

Some embodiments may be implemented in one or a combination of hardware, firmware and software. Embodiments may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. In some embodiments, a system or device may include one or more processors and may be configured with instructions stored on a computer-readable storage device.

What is claimed is:

1. A system, comprising:
   a photonic oscillator configured to produce a multifrequency optical signal having a spectrum that includes regularly spaced spectral lines;
   a first photodetector configured to convert the multifrequency optical signal to a first multifrequency electrical signal having a spectrum that includes the regularly spaced spectral lines;
   a first bandpass filter configured to attenuate all but a first spectral line of the spectrum of the first multifrequency electrical signal to form a first single-frequency electrical signal at the frequency of the first spectral line; and
   a first continuous-wave laser configured to lock to the multifrequency optical signal and produce a first continuous-wave optical signal at a first wavelength in response to the multifrequency optical signal.

2. The system of claim 1, further comprising a data encoder configured to:
   receive a digital data stream representing digital data;
   modulate the first continuous-wave optical signal to include the digital data, the modulation being synchronized to the first single-frequency electrical signal at the frequency of the first spectral line; and
   produce a modulated optical signal at the first wavelength and modulated at the frequency of the first spectral line.

3. The system of claim 2, wherein the data encoder is further configured to modulate the first continuous-wave optical signal using quadrature amplitude modulation.

4. The system of claim 1, further comprising a data decoder configured to:
   receive a modulated optical signal at the first wavelength and modulated at the frequency of the first spectral line;
   demodulate the modulated optical signal to extract digital data encoded on the modulated optical signal, the demodulation being synchronized to the first single-frequency electrical signal at the frequency of the first spectral line; and
   produce a digital data stream representing the extracted digital data.

5. The system of claim 4, wherein the data decoder is further configured to demodulate the modulated optical signal using quadrature amplitude demodulation.

6. The system of claim 1, further comprising:
   a second photodetector configured to produce a second multifrequency electrical signal in response to the multifrequency optical signal, the second multifrequency electrical signal having a spectrum that includes the regularly spaced spectral lines;
   a second bandpass filter configured to attenuate all but a second spectral line of the spectrum of the second multifrequency electrical signal to form a second single-frequency electrical signal at the frequency of the second spectral line; and
   a second continuous-wave laser configured to lock to the multifrequency optical signal and produce a second continuous-wave optical signal at a second wavelength in response to the multifrequency optical signal.

7. The system of claim 6, wherein the second wavelength is different from the first wavelength.

8. The system of claim 6, wherein the first and second spectral lines correspond to the same frequency.

9. The system of claim 6, further comprising:
   a data encoder configured to:
      receive a digital data stream representing transmittable digital data;
      modulate the first continuous-wave optical signal to include the transmittable digital data, the modulation being synchronized to the first single-frequency electrical signal at the frequency of the first spectral line; and
      produce an output modulated optical signal at the first wavelength and modulated at the frequency of the first spectral line; and
   a data decoder configured to:
      receive an input modulated optical signal at the second wavelength and modulated at the frequency of the second spectral line;
      demodulate the input modulated optical signal to extract received digital data encoded on the input modulated optical signal, the demodulation being synchronized to the second single-frequency electrical signal at the frequency of the second spectral line; and
      produce an input digital data stream representing the received digital data.

10. A system, comprising:
    a photonic oscillator configured to produce a multifrequency optical signal having a spectrum that includes regularly spaced spectral lines;
    a photodetector configured to convert the multifrequency optical signal to a multifrequency electrical signal having a spectrum that includes the regularly spaced spectral lines;
    a bandpass filter configured to attenuate all but a first spectral line of the spectrum of the multifrequency electrical signal to form a single-frequency electrical signal at the frequency of the first spectral line;
    a first continuous-wave laser configured to lock to the multifrequency optical signal and produce a first continuous-wave optical signal at a first wavelength in response to the multifrequency optical signal;
    a second continuous-wave laser configured to lock to the multifrequency optical signal and produce a second continuous-wave optical signal at a second wavelength in response to the multifrequency optical signal.

11. The system of claim 10, wherein the second wavelength is different from the first wavelength.

12. The system of claim 10, further comprising a data encoder configured to:
    receive a digital data stream representing digital data;
    modulate the first continuous-wave optical signal to include the digital data, the modulation being synchronized to the first single-frequency electrical signal at the frequency of the first spectral line; and
    produce a modulated optical signal at the first wavelength and modulated at the frequency of the first spectral line.

13. The system of claim 12, wherein the data encoder is further configured to modulate the first continuous-wave optical signal using quadrature amplitude modulation.

14. The system of claim 10, further comprising a data decoder configured to:
receive a modulated optical signal at the second wavelength and modulated at the frequency of the first spectral line;
demodulate the modulated optical signal to extract digital data encoded on the modulated optical signal, the demodulation being synchronized to the first single-frequency electrical signal at the frequency of the first spectral line; and
produce a digital data stream representing the extracted digital data.

15. The system of claim 14, wherein the data decoder is further configured to demodulate the modulated optical signal using quadrature amplitude demodulation.

16. A system, comprising:
a photonic oscillator configured to produce a multifrequency optical signal having a spectrum that includes regularly spaced spectral lines;
a first photodetector configured to convert the multifrequency optical signal to a first multifrequency electrical signal having a spectrum that includes the regularly spaced spectral lines;
a first bandpass filter configured to attenuate all but a first spectral line of the spectrum of the first multifrequency electrical signal to form a first single-frequency electrical signal at the frequency of the first spectral line;
a plurality of continuous-wave lasers configured to lock to the multifrequency optical signal and produce respective continuous-wave optical signals at respective wavelengths in response to the multifrequency optical signal, the wavelengths of the continuous-wave optical signals are different from one another.

17. The system of claim 16, further comprising:
a second photodetector configured to convert the multifrequency optical signal to a second multifrequency electrical signal having a spectrum that includes the regularly spaced spectral lines; and
a second bandpass filter configured to attenuate all but a second spectral line of the spectrum of the second multifrequency electrical signal to form a second single-frequency electrical signal at the frequency of the second spectral line.

18. The system of claim 17, further comprising a plurality of data encoders, each data encoder of the plurality configured to:
receive a digital data stream representing digital data;
modulate the respective continuous-wave optical signal to include the digital data, the modulation being synchronized to the first single-frequency electrical signal at the frequency of the first spectral line; and
produce a respective modulated optical signal at the respective wavelength and modulated at the frequency of the first spectral line.

19. The system of claim 18, further comprising a plurality of data decoders, each data decoder of the plurality configured to:
receive a respective modulated optical signal at the respective wavelength and modulated at the frequency of the second spectral line;
demodulate the modulated optical signal to extract digital data encoded on the modulated optical signal, the demodulation being synchronized to the second single-frequency electrical signal at the frequency of the second spectral line; and
produce a digital data stream representing the extracted digital data.

20. The system of claim 19, wherein:
each data encoder is further configured to modulate the respective continuous-wave optical signal using quadrature amplitude modulation;
each data decoder is further configured to demodulate the respective modulated optical signal using quadrature amplitude demodulation; and
the frequencies of the first and second spectral lines are equal.

* * * * *

UNITED STATES PATENT AND TRADEMARK OFFICE
CERTIFICATE OF CORRECTION

PATENT NO. : 9,647,770 B1  
APPLICATION NO. : 14/921146  
DATED : May 9, 2017  
INVENTOR(S) : Wilkinson et al.

Page 1 of 1

It is certified that error appears in the above-identified patent and that said Letters Patent is hereby corrected as shown below:

On the Title Page

In item (22), in "Filed", in Column 1, Line 1, after "2015", insert --¶(65) Prior Publication Data US 2017/0117970 A1 Apr. 27, 2017--

On page 2, in Column 2, under "Other Publications", Line 5, delete "Communi Cations/Rf" and insert --Communications/Rf-- therefor In the Specification In Column 4, Line 11, delete "mutlifrequency" and insert --multifrequency-- therefor In Column 6, Line 37, delete "4" and insert --$\lambda_1$,-- therefor In Column 8, Line 27, after "modulation", insert --.--

Signed and Sealed this  
Twenty-eighth Day of May, 2019

Andrei Iancu  
*Director of the United States Patent and Trademark Office*